United States Patent [19]

Schmitt et al.

[11] Patent Number: 5,252,139
[45] Date of Patent: Oct. 12, 1993

[54] PHOTOVOLTAIC THIN LAYERS PANEL STRUCTURE

[75] Inventors: Jacques Schmitt, La Ville du Bois; Alain Ricaud, Gif-sur-Yvette; Jean-Marie Siefert, Arcueil, all of France

[73] Assignee: Solems S.A., Palaiseau, France

[21] Appl. No.: 836,820

[22] Filed: Feb. 19, 1992

[30] Foreign Application Priority Data

Feb. 21, 1991 [FR] France .................. 91 02073
Feb. 21, 1991 [FR] France .................. 91 02074

[51] Int. Cl.$^5$ ........................................ H01L 31/048
[52] U.S. Cl. .................................. 136/251; 136/259; 428/304.4; 428/306.6; 428/307.3; 428/308.4; 428/319.1; 428/319.3
[58] Field of Search ............ 136/244, 251, 259; 428/304.4, 306.6, 307.3, 308.4, 319.3, 319.1

[56] References Cited

U.S. PATENT DOCUMENTS

| | | | |
|---|---|---|---|
| 3,565,719 | 2/1971 | Webb | 156/212 |
| 4,243,432 | 1/1981 | Jordan et al. | 136/244 |
| 4,262,161 | 4/1981 | Carey | 136/256 |
| 4,530,739 | 7/1985 | Hanak et al. | 204/4 |
| 4,542,255 | 9/1985 | Tanner et al. | 136/249 |
| 4,686,321 | 8/1987 | Kishi | 136/244 |
| 4,795,500 | 1/1989 | Kishi et al. | 136/244 |

OTHER PUBLICATIONS

M. Ohnishi et al, *Conference Record; 21st IEEE Photovoltaic Specialists Conference* (May 1990), pp. 1394–1399.
K. Mitchell, "CuInSe2 Cells and Modules," *IEEE Transactions on Electron Devices*, vol. 37, No. 2, Feb. 1990, pp. 410–417.
E. Krisl, "Thin Film Coatings for Improved Coverglass Thermal Characteristics," *18th IEEE Photovoltaic Specialists Conferences*, Oct. 21, 1985, pp. 692–696.
Y. Kishi, "See-through Amorton: Translucent Amorphous Silicon Solar Cell," *IEEE Journal of Electronic Engineering*, vol. 24, No. 245, May 1987, pp. 70–72.
Patent Abstracts of Japan, vol. 10, No. 279, (E-439) (2335) Sep. 20, 1986 & JP-A-61 099 387 May 17, 1986.
Patent Abstracts of Japan, vol. 10, No. 129 (E-402) (2186) May 14, 1986 & JP-A-60 260 164 Dec. 23, 1985.
Patent Abstracts of Japan, vol. 10, No. 75 (E-390) (2132) Mar. 25, 1985 & JP-A-60-220 977 Nov. 5, 1985.
Patent Abstracts of Japan, vol. 13, Ho. 493 (E-842) Nov. 8, 1989 & JP-A-01 196 181 Aug. 7, 1989.

*Primary Examiner*—Aaron Weisstuch
*Attorney, Agent, or Firm*—Pollock, VandeSande & Priddy

[57] ABSTRACT

Panel structure suitable for forming a photovoltaic device, comprising an electrically insulating transparent support substrate; photosensitive elements constituted by thin layers stacked on a first face of the said substrate and comprising an opaque electrically conducting layer, openings being formed through this opaque layer in order to allow a portion of the light received by the structure to traverse the said photosensitive elements; an electrically insulating transparent potting layer covering the same photoactive conversion elements; and, over the top, a protecting plate. This plate may be curved. In this case, the potting layer will be constituted by an adhesive sheet.

17 Claims, 4 Drawing Sheets

PHOTOVOLTAIC THIN LAYERS PANEL STRUCTURE

RELATED CO-PENDING APPLICATION

The following co-pending application is related to the present invention: U.S. Ser. No. 07/836,819, filed Feb. 19, 1992.

The invention relates to structures having a characteristic of partial transparency, combining the conventional functions of a solar structure capable of generating an electric current with that of a panel partially allowing the light to pass. Two fields of application are particularly aimed at: panels such as building window panels and thin-film solar modules and cells.

Of course, this concept of "partial transparency" is already used in everyday life, for example when a blind, a slotted shutter or any other partially open barrier whose function is to occlude the light partially while nonetheless keeping certain parts transparent to this light, is placed in the location of an opening exposed to sunlight.

According to a first characteristic, the invention envisages applying this principle to a panel-shaped structure (being allied to photovoltaic devices by the presence of thin films) of the type comprising:

a transparent, electrically insulating substrate, an opaque metallic thin layer disposed over a first face of the substrate, cut-outs or openings being provided through this layer in order to allow the light to traverse it, thus enabling the desired partial transparency to be achieved, a thin layer made from semiconductor material disposed over the said opaque metallic layer (if required, sufficiently thin in order to allow the light to pass through it), a transparent electrically conducting thin layer disposed over the said semiconducting layer, an electrically insulating transparent potting layer disposed over the said transparent conducting layer and an electrically insulating transparent protecting plate covering the said potting layer.

One advantage of such a structure is, taking into account the nature of the transparent substrates generally used (glass or transparent polymer), that it facilitates the production phases of the semiconducting layer.

In addition, insofar as the transparent conducting layer will generally be produced from transparent conducting oxide (TCO), the mechanical coupling characteristics between this layer and any encapsulating layer useful for sealing and for strength will be of very high quality.

There appears to be a market therefore for this type of product, especially as, notably in the field of solar cells, certain existing devices have drawbacks related in particular to their manufacturing cost and to the difficulty of rendering the various layers constituting them mutually compatible chemically, electrically, and mechanically.

Of course, the invention was not achieved without difficulties or obstacles.

Thus, tests have shown that, under certain conditions, producing transparency cut-outs having the shape of peripherally closed, non-elongate holes or orifices ran the risk of inducing perturbations in the flow of the lines of current, in the case of a solar cell or module.

It then seemed that a configuration of slit-like cut-outs (even with closed contour), elongated in a direction transverse to the structure and perpendicular to the thickness of the layer in question, would limit this problem, the cell having in this case, at least partially, a "stripped" structure.

In this situation, it still turned out that risks of short-circuits could remain at the location of these elongate transparency openings should there be an edge defect.

This is why, in particular in a solar module application comprising several elementary cells, a complementary characteristic of the invention proposes to open the said slits at their opposite longitudinal ends, on each elementary cell, in such a manner that the strips of the opaque conducting layer extend continuously from one lateral edge to the opposite edge of the cell in question.

By suitably orienting these slits, and insofar as the latter will divide the active portion of the cell into as many non-topologically connected active zones (as opposed to holes or any other closed-contour shape), the homogeneous sheet-like flow of the lines of current in the layers in question will thus be favored all the more.

Another object of the invention is to propose a complete solar modular constituted by several solar cells connected electrically in series and each having a structure as defined hereinabove.

Another characteristic of the invention is also to apply the principle of the partial transparency obtained by the openings provided at least in the opaque metallic layer, to the field of, notably, sun roofs of motor vehicles or boats, requiring the use of a light-receptive transparent plate which is curved.

In this case, the transparent protecting plate will therefore be curved and the intermediate filling layer between this plate and the thin layers forming the photosensitive elements (front and rear metallic layers and semiconducting layer) will therefore be constituted by an insulating and transparent adhesive sheet, and various stacking arrangements of layers can be envisaged.

It should be understood that everything which has been stated hereinabove could also relate to the construction and building field for the production, for example, of window, door, veranda panels, etc. Of course, in this case, current conversion and flow (photoelectricity) aspects would no longer necessarily be of interest.

BRIEF DESCRIPTION OF THE DRAWINGS

Other characteristics and advantages of the invention will further emerge from the description which will follow with reference to the attached drawings given solely by way of example and in which.

Figure 1:
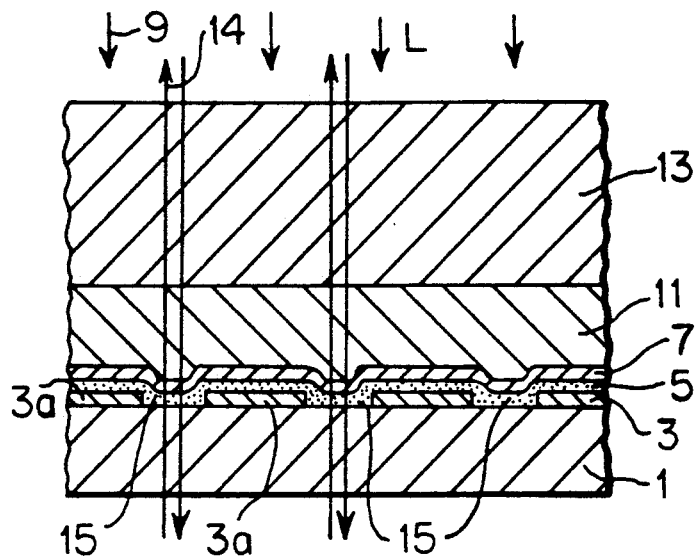
FIG. 1 is a diagrammatic view, in cross-section, of a plane structure in accordance with the invention, integrating the concept of partial transparency.

Referring first of all to FIG. 1, there is illustrated a structure which can be used in various applications and especially as a solar cell or module structure, a semitransparent panel structure for a building, or a motor vehicle or boat roof panel structure.

As shown, this device therefore comprises an insulating transparent substrate 1 on which is deposited an opaque metallic layer 3, such as of aluminum, silver, or titanium, a layer 5 made from semiconducting material, for example, amorphous silicon, cadmium sulphide, or telluride, etc., having, for example, an n-i-p or p-i-n junction, and a transparent conducting layer 7 over the semiconducting layer 5.

The successive depositions of the various thin layers 3, 5, 7 could be carried out as follows:

The first metallic layer 3, in the form of a metallic film (Al; Ag; TCO/Ag; Al/TiAg; etc.) of several hundreds of nanometers thickness (for example 100 to 300 nm), may be formed on a glass substrate 1 of approximately several millimeters or several centimeters thickness by deposition via cathodic magnetron sputtering.

It will be recalled that in this type of technique, a target constituted by the material to be deposited is disposed at a short distance from the support (substrate 1). Then, an inert gas (for example argon) is introduced at a low pressure (approximately 1 Pa) and a plasma of this gas is created by applying a DC or radiofrequency (for example 13.56 MHz) electrical voltage between the target and the substrate.

Deposition using the magnetron cathode can be carried out at a temperature of the order of 50° to 100° C.

Once this layer has been produced, the semiconducting layer 5 is then formed on it by means of a deposition "under vacuum" (several Pa) of the plasma CVD type. This layer may be based on aSi:H (or indeed on CuInSe$_2$, CdS, GaAs) and have a thickness of 300 to 400 nanometers.

For deposition of the transparent layer 7, cathodic magnetron sputtering can again be used, in this case based on a transparent conductive oxide "TCO" (such as SnO$_2$, ZnO, TiO$_2$, etc.) which can have a thickness of the order of a hundred nanometers (100 to 200 nm, for example).

For the purposes of mechanical and chemical protection and of coupling, the layer 7 is covered by an insulating layer 11, also transparent, for example made from resin transparent to natural light, such as a layer of ethylene-vinyl acetate (EVA), itself covered by an electrically insulating transparent rigid plate 13, preferably made from glass, which can be strengthened.

The transparent substrate 1 will advantageously be produced from glass, with the advantage of being relatively inexpensive, very passive, inert from the point of view of coloration and being one of the best barriers to the penetration of corrodents.

With such a construction, incident light L will traverse the transparent plate 13 before reaching the active layers 3, 5, 7 (see arrow 9).

Of course, in the figures, the relative thicknesses of the various elements constituting the device have not always been represented, the glass plates 1 and 13 being much thicker than the layers 3, 5, 7.

In FIG. 1, it will further be noted that openings or cut-outs 15 have been provided right through the thickness of the opaque "electrode" 3 in such a manner that the latter, like the whole device, can be traversed by the light at these locations, in order that it is possible to see through it, especially in the reverse direction, along the arrow 14.

In order to give such a structure the desired partial transparency, several configurations of the said cut-outs or openings may be adopted.

First, it is possible to utilize closed-contour orifices or holes.

Figure 2:
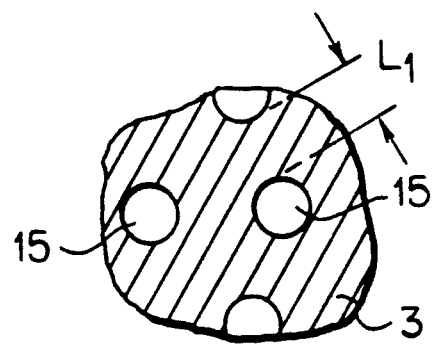
FIGS. 2, 3, and 4 show three possible variant embodiments of the partial transparency openings in a diagrammatic view taken over into the plane in the direction of the arrow II of FIG. 1.

This is the solution illustrated in FIG. 2.

However, especially in applications where it is important to take into account the electrical current flow, the presence of such holes did not favor the progress of the lines of current flow and ran the risk of increasing the chances of short-circuits between the layers 3 and 7.

Figure 3:
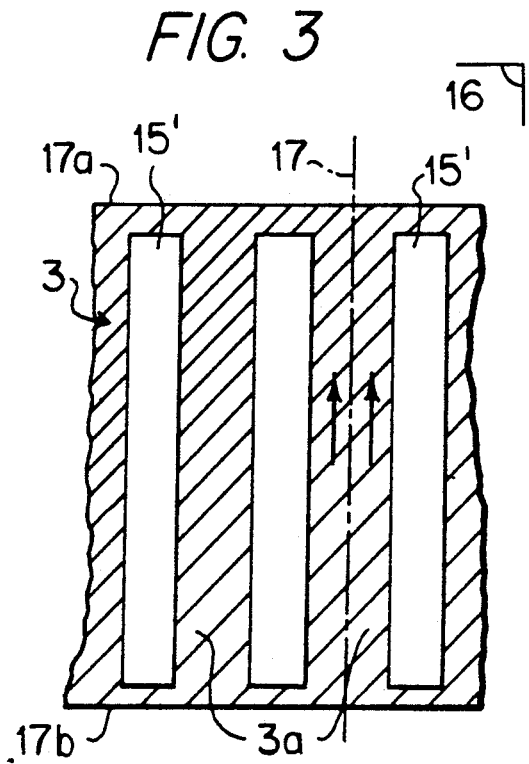

After numerous fruitless experiments, a first replacement solution, deemed to be preferable and illustrated in FIG. 3, has been found in the production of continuous slits 15 which are elongate (in a direction transverse to the general surface 16 of the structure) and extend advantageously at least almost to the two opposite sides or edges 17a, 17b of this structure. In an application where the flow of the current is important, the orientation of these slits will therefore be preferably parallel to the direction 17 of the lines of current flow progressing through the "electrode" 3.

Figure 4:
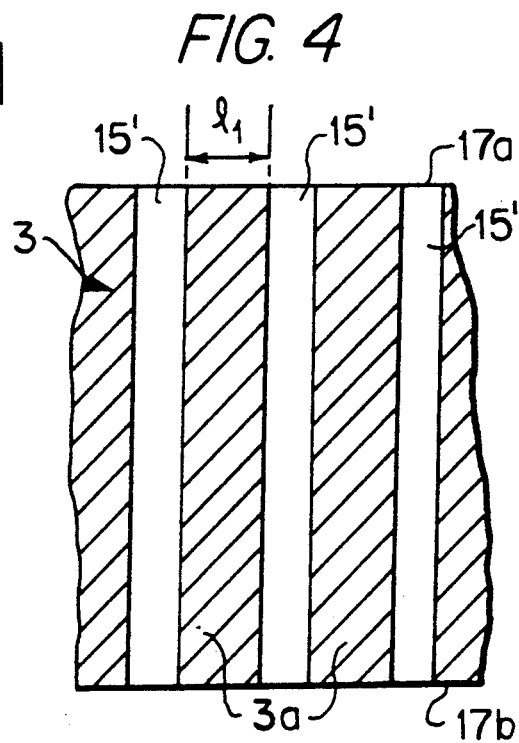

In order to further limit the risk of short-circuits, still in a "solar" application, a second solution consists as illustrated in FIG. 4, in causing the slits to extend longitudinally to the edges 17 of the substrate.

Thus configured, the opaque layer 3 exhibits the form of a series of straight strips 3a, which can be electrically conducting, extending continuously between the above-mentioned opposite sides 17a, 17b of each structure, one strip being continuously separated or isolated from the neighboring strip by a continuous "transparent" slit 15' formed through the thickness of at least the layer 3 and therefore longitudinally being open, as seen in FIG. 4, at either of the said sides 17a, 17b.

Figure 5:
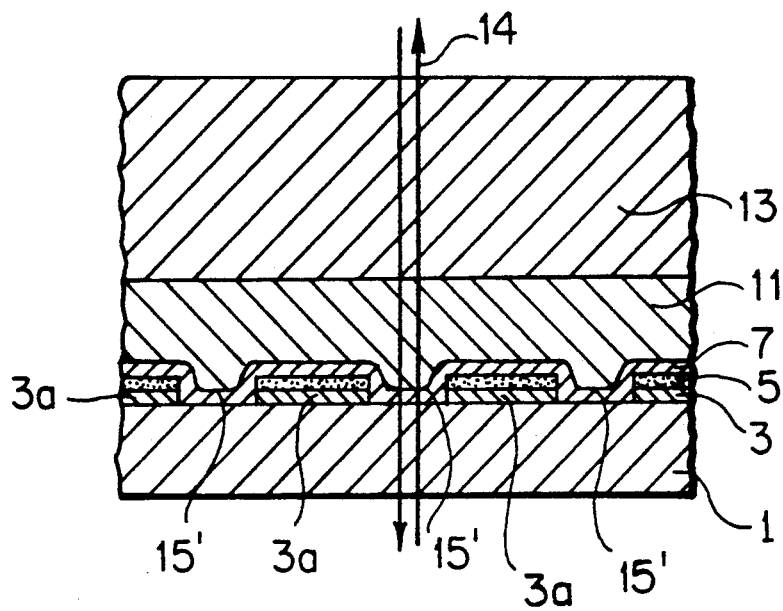
FIG. 5 is an identical view to that of FIG. 1 showing the possible form of the transparency openings through both the opaque conducting layer and the semi-conducting layer.

In FIG. 5, it will be noted that the slits 15', formed not only through the opaque layer 3 but also through the semiconducting layer 5, are filled by the intermediate potting and protecting layer 11, which is preferably neutral from the point of view of coloration deposited by spraying and whose material adheres to the covering plate 13.

Of course, such a cut-out of the layer 5 could also have been provided in the embodiment of FIG. 2.

It will be noted that, whatever their shape, the transparency cut-outs or openings 15, 15' may be obtained by laser ablation, by selective photolitho-etching with cathodic sputtering or by a "patterning by lift-off" technique (see especially U.S. Pat. Nos. 4,443,651 and 4,795,500).

In general, since the purpose of the "partial transparency" is not so much to allow incident light to pass through each structure but to enable a person to see or distinguish a shape through it, especially in the reverse direction (arrow 14 in FIGS. 1 and 5), it may reasonably be considered that, for an image to be able to be seen by the human eye in most of its detail, the width $l_1$ of the spaces (or strips) between cut-outs should not exceed approximately 2 to 2.5 mm with preferably a substantially uniform distribution of the cut-outs.

Figure 6:
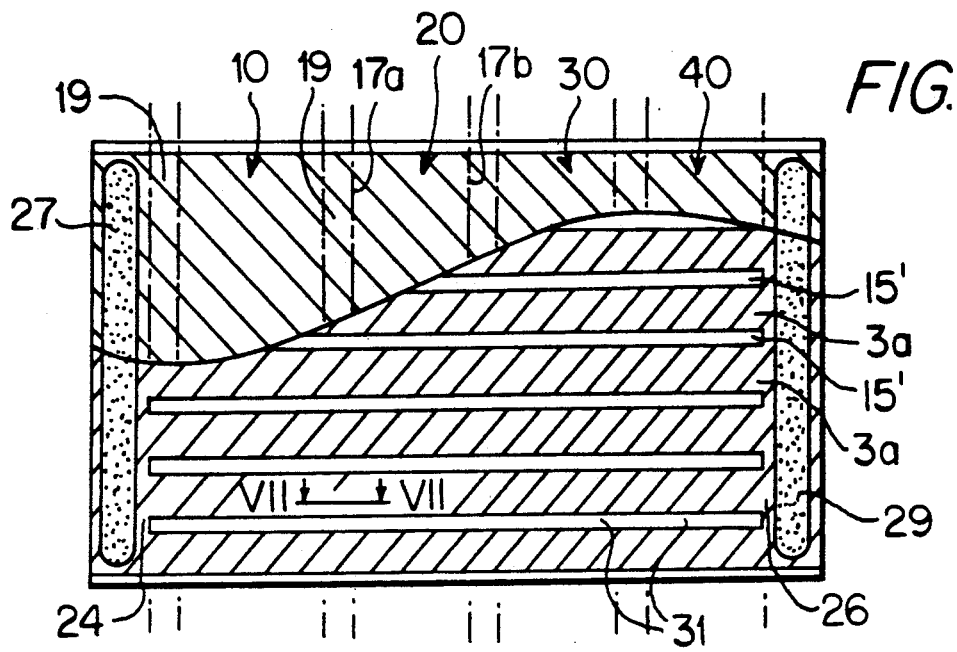
FIG. 6 is a diagrammatic plan view of a solar module in accordance with the invention, comprising a series of elementary cells connected in series.
Figure 7:
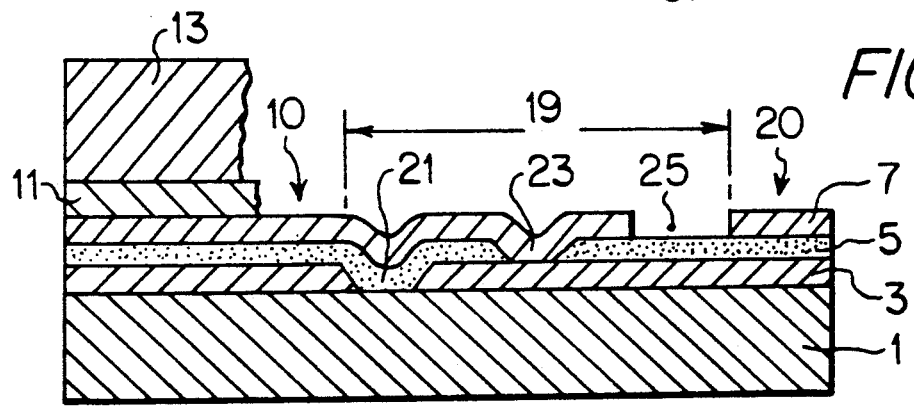
FIG. 7 is a localized view, in transverse cross-section, along the line VII—VII of FIG. 6.
Figure 8:
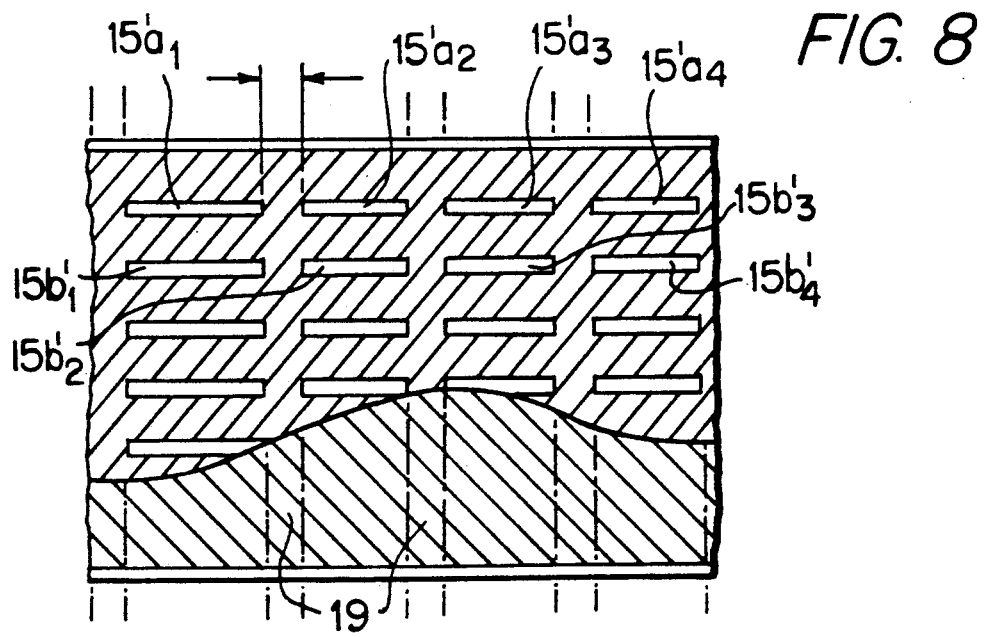
FIG. 8 is a diagrammatic plan view of a variant embodiment of the module illustrated in FIG. 6.

Illustrated in FIGS. 6 to 8 is the application of the structure of the preceding figures to the production of a solar module.

The module is constituted by a series of elementary solar cells each having one of the structures presented hereinabove (FIGS. 1 to 5), these cells being combined in series one after the other.

FIG. 6 shows, partially, such a module comprising four elementary solar cells 10, 20, 30, 40 connected in pairs, on their lateral sides, such as 17a, 17b for the cell 20, via serial interconnection strips represented diagrammatically by the zones 19.

Several techniques may be used for producing these connections. U.S. Pat. No. 4,243,432 describes one possibility, the principle of which has been illustrated in FIG. 7 where a strip or interconnection zone 19 constituted by three parallel and substantially adjacent zones may be seen: a zone 21 for interrupting the opaque conducting layer forming the front electrode 3 (where the photovoltaic conversion layer 5 of a cell comes directly into contact with the substrate), a zone 23 for piercing or interrupting this same semiconducting layer (where the transparent conducting layer forming the rear electrode 7 comes directly into contact with the front electrode 3 of a neighboring cell) and then another zone 25 for interrupting the rear electrode 7.

It will be noted that one easy manner of producing such a module with the "stripped" semi-transparency may consist in orienting the strips 3a of each elementary cell substantially perpendicularly to the direction of the serial interconnection strips 19, by cutting out (for example by etching together with removal of material, or by "lift-off") the slits 15' through the layer or layers in question, this being carried out over most of the length of the module. It will then suffice to reconnect, conventionally, all the strips to each other on the opposite lateral sides 24, 26 of the module and to provide lateral contactmaking zones 27, 29, as illustrated in FIG. 6, connected to electrical connection cable leads (not shown).

This technique presents no real difficulty, save, possibly, if the production of the slits 15' open at their ends interferes with the formation of the strips 19, at the location of their intersections, such as those identified by 31 in FIG. 6.

In particular, in this case, it is possible to make use of the geometry of FIG. 8 where the module illustrated is constituted by a series of cells having a structure of the type of that of FIG. 3 with slits 15' that do not fully extend and take the form, by line, of sections 15'a1, 15'a2, ..., 15'a4, 15'b1 ... etc., the interruptions being at the locations of the interconnection strips 19, while the width 1' between two consecutive slit sections of any one line may be approximately 0.5 to 2 mm (a priori greater than or equal to the width of the strips 19).

Figure 9:
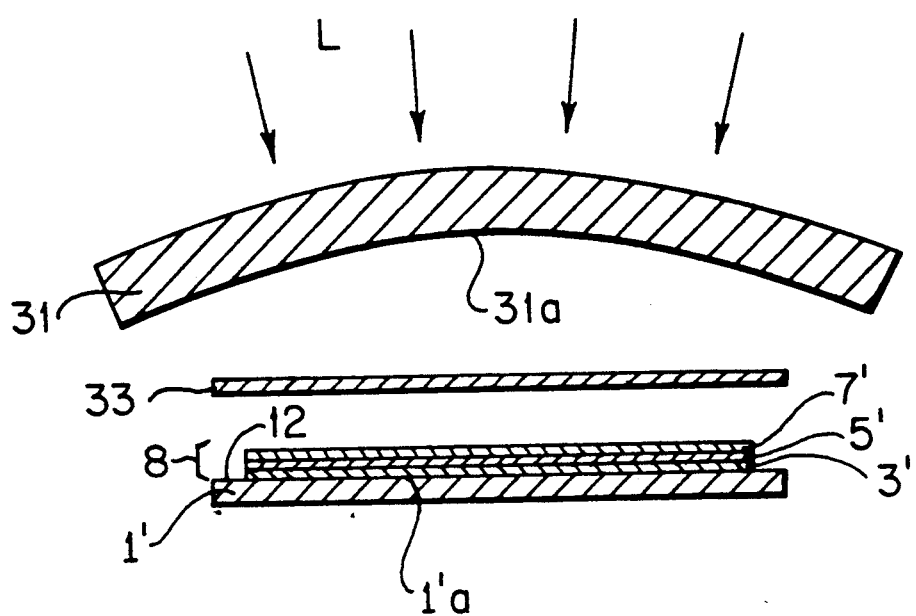
FIG. 9 is a view, in exploded cross-section, of an embodiment of a curved structure having partial transparency.

In FIG. 9 there is shown an application of the invention to the production of a curved structure, i.e., a structure whose protective transparent plate 13 and the intermediate pottant layer 11 such as are illustrated in FIG. 1, will not correspond respectively to a curved plate 31 and a transparent adhesive layer 33.

There is thus seen in FIG. 9, in transverse cross-section and in exploded view, a panel comprising, in successions, starting from the side which receives the incident light L, a light-receiving curved transparent front plate 31, and adhesive film 33, photo-sensitive elements which are made from thin films and identified in their entirety by 8, and a support substrate 1'. It will be noted that the stacked elements 8 will have, in plan, dimensions less than that of the substrate, in such a manner as to form a border 12 thereat.

Although it is advisable to use a rigid substrate, a relatively flexible sheet, or indeed a composite structure, could be provided.

As far as the thin layers of the photo-sensitive elements 8 are concerned, the latter are, in the example of FIG. 9, constituted by an opaque front metallic layer 3' (Ag, Al, Ti, etc.) deposited over the front face 1'a of the substrate 1', by a photoactive layer 5' made from semi-conducting material (capable of forming a photovoltaic conversion layer), and by a transparent rear electrically-conducting layer 7' (which can form a rear electrode of a solar cell). Optionally, the stacking arrangement of the layers could be reversed and provision made, starting from the substrate 1', for the transparent electrically conducting layer, then for a layer made from semiconducting material, and then for an opaque metallic layer.

Whatever the arrangement, with such a construction, the layers 8 will be sandwiched between the substrate 1' and the transparent curved plate 31 with the adhesive film 33 interposed in order to hold the whole structure together.

This film, having at least the same dimensions as the substrate, will preferably be constituted by a transparent adhesive layer, transparent to natural light, whose thickness and consistency will be chosen in order that a slight increase in force may be absorbed when the structure is assembled, without impairing the reliability of the layers 8.

As regards the curved transparent plate 31, this may consist of a plate of glass or of any other strong, transparent electrically insulating material. Tempered, or even laminated, glass would be entirely suitable.

The accepted material and the thickness of the front plate 31 will in practice be chosen in order for its mechanical strength to be greater than that of the substrate 1'.

There will now be described a preferred embodiment of the structure of FIG. 9, the various photosensitive layers 8 being already formed on the substrate which will therefore advantageously be rigid and substantially planar at this moment.

Figure 10:
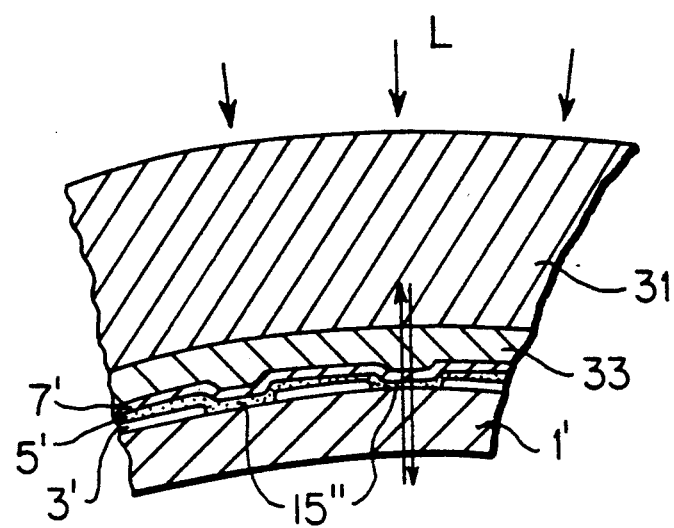
FIG. 10 is an enlarged localized view of the structure of FIG. 9 with its elements joined together.

After, optionally, the electrical connection terminals (not shown) have been installed and after having interposed the adhesive film 33, opposing compressive forces are applied externally, on the one hand on the substrate 1' and on the other hand on the plate 31, in order to impart the concave shape of the surface 31a to the layers 8 and to the substrate 1' which will then adhere to the said plate via the film 33. FIG. 10 shows, in a localized view, such an assembled structure.

It may furthermore be seen clearly in this FIG. 10 that the principle of "partial transparency" already presented has once again been provided in this curved assembly.

Figure 11:
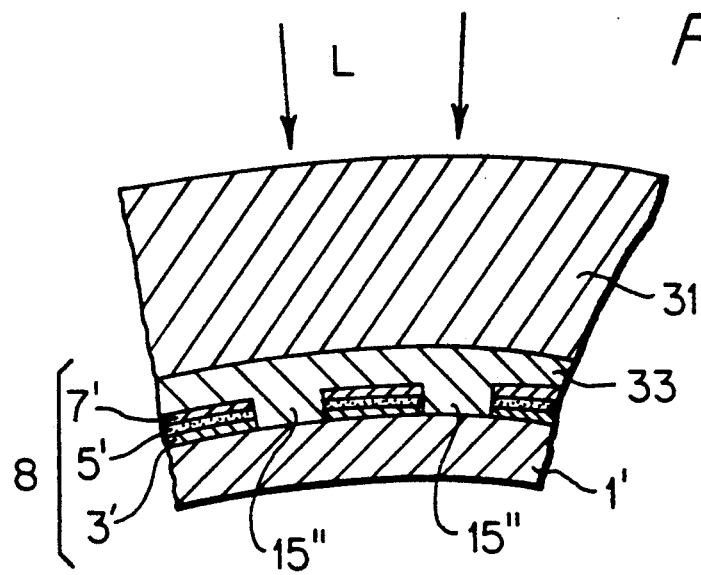
FIG. 11 illustrates, still in enlarged view, a variant embodiment of the detail of FIG. 10.

In this case, the transparency openings 15" have been formed solely through the thickness of the opaque metallic layer 3'. However, FIG. 11 envisages the case of a cut-out of the three layers 3', 5', 7'.

Even if, as previously, various shapes of openings 15" could be accepted, it is still advisable to produce them in the shape of slits, of the type shown in FIGS. 3 and 4.

It will also be understood that, in an application to a solar module, the transparency openings 15" will in practice, and as previously described, be provided in a succession of adjacent elementary cells mutually joined together, for example, in series as in the case of FIGS. 6 and 8.

From the foregoing description of the invention, it is seen that the imagined "transparent" structures ("see-through structures") thus have, more particularly, two major applications, namely:

to act as panels (plane or curved) through which it is possible to see, at the location of the cut-outs which are formed therein, to be used both for their photoelectric and partial transparency characteristics.

In the case of a solar module comprising several elementary cells, the usual dimensions should lie between several tens of cm² and one m² (or even several m²). For building facade panels, larger dimensions could be used.

What is claimed is:

1. A panel structure comprising:
   an electrically insulating transparent support substrate,
   an opaque metallic thin layer deposited over a first face of said support substrate,
   a thin layer made form semiconducting material deposited over said opaque metallic layer,
   a transparent electrically conducting thin layer deposited over said layer made from semiconducting material,
   an electrically insulating transparent potting layer disposed on said transparent conducting layer,
   an electrically insulating transparent protection plate disposed on said potting layer,
   openings being formed through said opaque metallic layer to allow light to traverse said structure, said openings being filled with said semiconducting material of the semiconductive layer.

2. A structure according to claim 1 wherein said openings comprise elongated grooves providing strips of material therebetween.

3. A structure according to claim 2 wherein said grooves extend parallel to each other, without discontinuity, from a first edge of the structure to a second opposite edge thereof.

4. A structure according to claim 1 wherein:
   said insulating potting layer consists of a transparent adhesive sheet,
   said transparent protection plate consists of a curved plate, and
   said first face of a support substrate adheres with said thin layers disposed thereon, to said transparent protecting plate through said adhesive sheet.

5. A structure according to claim 1 wherein the distance between two adjacent openings is less than or equal to substantially 2.5 mm.

6. A structure according to claim 1, wherein:
   said insulating potting layer consists of a transparent adhesive sheet,
   said transparent plate consists of a curved plate, and
   said first face of the support substrate adheres, with said thin layers disposed thereon, to said transparent protecting plate through said adhesive sheet, the distance between two adjacent openings being less than or equal to substantially 2.5 mm.

7. A panel structure comprising:
   an electrically insulating transparent support substrate,
   an opaque metallic thin layer deposited over a first face of said support substrate,
   a thin layer made form semiconducting material deposited over said opaque metallic layer,
   a transparent electrically conducting thin layer deposited over said layer made from semiconducting material,
   an electrically insulating transparent potting layer disposed on said transparent conducting layer, and
   an electrically insulating transparent protection plate disposed on said potting layer,
   openings being formed through said opaque metallic layer and said semiconductive layer to allow light to traverse said structure, said openings being filled with the material of said transparent electrically conducting layer.

8. A structure according to claim 7 wherein said openings comprise elongated grooves providing strips of material therebetween.

9. A structure according to claim 8 wherein said grooves extend parallel to each other, without discontinuity, from substantially a first edge of the structure up to a second opposite edge thereof.

10. A photovoltaic cell adapted for receiving light, comprising:
    an electrically insulting transparent support substrate,
    an opaque metallic thin layer deposited over a first face of said support substrate,
    a thin layer made form semiconducting material deposited over said opaque metallic layer,
    a transparent electrically conducting thin layer deposited over said layer made from semiconducting material,
    an electrically insulating transparent potting layer disposed on said transparent conducting layer,
    an electrically insulating transparent protection plate disposed on said potting layer, and
    elongated grooves being formed at least through said opaque metallic layer to allow light to pass through the entire cell.

11. A cell according to claim 10 wherein said grooves extend parallel to each other, without discontinuity, from a first edge of said cell up a second opposite edge thereof, thus dividing said opaque conducting layer into a series of continuous strips.

12. A solar module comprising several elementary photovoltaic cells connected electrically in series at the location of serial interconnection zones, these cells being formed on an electrically insulating transparent substrate, each cell comprising:
    an opaque electrically conducting layer, forming a front electrode deposited over a first face of the substrate,
    a semiconducting photoelectric conversion layer deposited over said front electrode,
    a transparent electrically conducting layer, forming a rear electrode, deposited over said semiconducting layer,
    an electrically insulating transparent potting layer disposed on said rear electrode,
    an electrically insulating transparent protection plate covering said potting layer,
    elongated grooves being formed through said opaque front electrode to allow light to traverse the entire module, said grooves extending parallel to each other, the distance between two successive grooves being less than or equal to substantially 2.5 mm.

13. A module according to claim 12 wherein:
said insulating potting layer consists of a transparent adhesive sheet,
said transparent protection plate consists of a curved plate,
said support substrate adheres, to said first face thereof and with said layers disposed thereon, to said transparent plate through said adhesive sheet.

14. A module according to claim 13 wherein said support substrate is produced from a relatively rigid material having a plane shape, said layers deposited thereon being performed over the first face of said plane-shaped substrate before said substrate is adhered to said transparent protection plate under the effect of applied pressure, in opposing directions thereon, and on said plane-shaped substrate, in such a manner that said substrate is bent along said concave surface of the transparent protection plate.

15. A panel structure adapted for receiving light, comprising:
an electrically insulating transparent support substrate,
photosensitive thin film elements stacked on a first face of said substrate and comprising an opaque electrically conducting layer through which openings are formed to allow a portion of the light received by the structure to pass therethrough,
an electrically insulating transparent layer forming an adhesive sheet covering said photosensitive conversion elements, and
an electrically insulating transparent curved protection plate disposed over said transparent layer,
said first face of the substrate adhering with said photosensitive elements to said electrically insulating transparent plate through said adhesive sheet.

16. A structure according to claim 15 wherein said openings formed through said opaque conducting layer have the shape of elongated grooves providing strips of material therebetween.

17. A panel structure comprising:
an electrically insulating transparent support substrate,
an opaque metallic thin layer deposited over a first face of said support substrate,
a thin layer made from semiconducting material deposited over said opaque metallic layer,
a transparent electrically conducting thin layer deposited over said layer made from semiconducting material,
an electrically insulating transparent potting layer disposed on said transparent conducting layer,
an electrically insulating transparent protection plate disposed on said potting layer, and
openings being formed through at least said opaque metallic layer to allow light to entirely traverse said structure.

* * * * *